United States Patent
Isshiki

(10) Patent No.: US 9,425,379 B2
(45) Date of Patent: *Aug. 23, 2016

(54) PIEZOELECTRIC ELEMENT AND PIEZOELECTRIC ELEMENT APPLICATION DEVICE

(71) Applicant: SEIKO EPSON CORPORATION, Tokyo (JP)

(72) Inventor: Tetsuya Isshiki, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/665,768

(22) Filed: Mar. 23, 2015

(65) Prior Publication Data

US 2015/0270475 A1 Sep. 24, 2015

(30) Foreign Application Priority Data

Mar. 24, 2014 (JP) ................................ 2014-059808

(51) Int. Cl.
*H01L 41/08* (2006.01)
*H01L 41/187* (2006.01)
*B41J 2/14* (2006.01)
*H01L 41/09* (2006.01)
*B41J 2/16* (2006.01)
*H01L 41/318* (2013.01)

(52) U.S. Cl.
CPC ......... *H01L 41/0815* (2013.01); *B41J 2/14233* (2013.01); *B41J 2/161* (2013.01); *B41J 2/1628* (2013.01); *B41J 2/1629* (2013.01); *B41J 2/1631* (2013.01); *B41J 2/1645* (2013.01); *B41J 2/1646* (2013.01); *H01L 41/0973* (2013.01); *H01L 41/1878* (2013.01); *H01L 41/318* (2013.01)

(58) Field of Classification Search
CPC .... C04B 35/475; H01L 41/0815; H01L 41/18
USPC ........................................................ 310/358
See application file for complete search history.

(56) References Cited

U.S. PATENT DOCUMENTS

| | | | | |
|---|---|---|---|---|
| 7,063,407 B2 * | 6/2006 | Nishimura | ........... | B41J 2/14233 310/324 |
| 9,156,258 B2 * | 10/2015 | Isshiki | ................. | B41J 2/14201 |
| 2005/0218756 A1 * | 10/2005 | Fujii | ........................ | B41J 2/161 310/358 |
| 2006/0091494 A1 * | 5/2006 | Miyamoto | ........... | C01G 29/006 257/532 |
| 2006/0249811 A1 * | 11/2006 | Sakashita | ............... | B82Y 30/00 257/532 |
| 2007/0236104 A1 | 10/2007 | Fujii | | |

(Continued)

FOREIGN PATENT DOCUMENTS

| | | |
|---|---|---|
| JP | 2002-083937 | 3/2002 |
| JP | 2004-066600 | 3/2004 |

(Continued)

*Primary Examiner* — J. San Martin
(74) *Attorney, Agent, or Firm* — Workman Nydegger

(57) ABSTRACT

A piezoelectric element including a first electrode 60, a piezoelectric body layer 70, and a second electrode 80, in which a seed layer 65, which performs control such that the piezoelectric body layer 70 is preferentially oriented with respect to a specific crystal plane, is formed between the first electrode 60 and the piezoelectric body layer 70, and the seed layer 65 is formed from a composite oxide with a perovskite structure that includes at least Bi, Sr, Fe and Ti and an element ratio of Bi, Sr, Fe, and Ti in the seed layer satisfies the Formula (1) below.

$$Bi:Sr:Fe:Ti=x:(1-y):y:1-z:z \qquad (1)$$

$(1.0 \le x < 1.3, 0 < y < 0.4, 0.4 \le z \le 0.6)$.

5 Claims, 15 Drawing Sheets

(56) References Cited

U.S. PATENT DOCUMENTS

| | | |
|---|---|---|
| 2007/0241642 A1 | 10/2007 | Miyazawa et al. |
| 2010/0096952 A1* | 4/2010 | Fukuoka ............... C01G 29/006 310/365 |
| 2010/0245493 A1* | 9/2010 | Uraki ................... B41J 2/14209 347/71 |
| 2010/0264354 A1* | 10/2010 | Uraki ................... C04B 35/495 252/62.9 PZ |
| 2011/0050811 A1 | 3/2011 | Wang |
| 2011/0074249 A1* | 3/2011 | Sakashita ................. C08K 3/22 310/339 |
| 2012/0120161 A1 | 5/2012 | Sakai et al. |
| 2012/0147100 A1* | 6/2012 | Nawano ............... B41J 2/14233 347/71 |
| 2013/0271532 A1 | 10/2013 | Sakai |
| 2014/0210915 A1 | 7/2014 | Isshiki |
| 2015/0084486 A1* | 3/2015 | Eguchi ................ H01L 41/0477 310/360 |
| 2015/0138281 A1* | 5/2015 | Kitada ................. B41J 2/14201 347/68 |
| 2015/0236243 A1* | 8/2015 | Kitada ................. B41J 2/14201 347/71 |

FOREIGN PATENT DOCUMENTS

| | | |
|---|---|---|
| JP | 2005-340428 | 12/2005 |
| JP | 2007-287745 | 11/2007 |
| JP | 2011-046129 | 3/2011 |
| JP | 2013-222748 | 10/2013 |
| JP | 2014-146772 | 8/2014 |

* cited by examiner

EXAMPLE 1

EXAMPLE 2

EXAMPLE 3

COMPARATIVE EXAMPLE 1

COMPARATIVE EXAMPLE 2

EXAMPLE 1

EXAMPLE 2

EXAMPLE 3

COMPARATIVE EXAMPLE 1

COMPARATIVE EXAMPLE 2

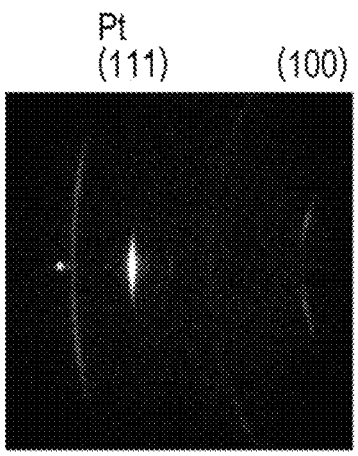
FIG. 12A  EXAMPLE 4
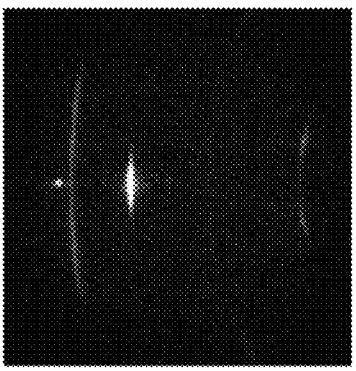
FIG. 12B  EXAMPLE 5
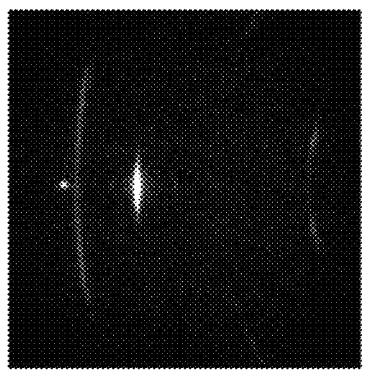
FIG. 12C  EXAMPLE 6

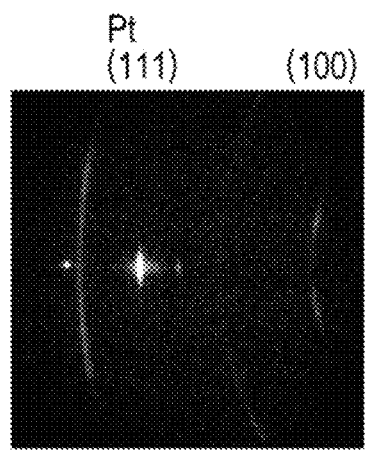
FIG. 13A — EXAMPLE 7
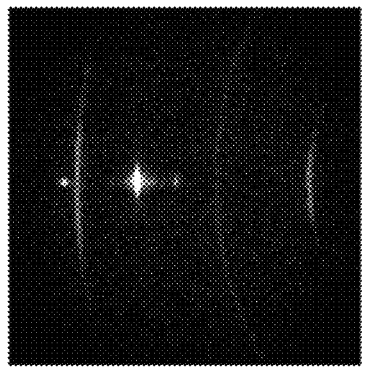
FIG. 13B — EXAMPLE 8

PIEZOELECTRIC ELEMENT AND PIEZOELECTRIC ELEMENT APPLICATION DEVICE

BACKGROUND

1. Technical Field

The present invention relates to a piezoelectric element and a piezoelectric application device.

2. Related Art

In the related art, as a representative example of a piezoelectric application device, for example, an ink jet type recording head that ejects ink from a nozzle opening by deforming a vibration plate, that partitions a portion of pressure chambers, which are in communication with nozzle openings, using a piezoelectric element, and pressurizing ink inside the pressure chambers, is well known.

As a piezoelectric element that is used in an ink jet type recording head, a material that exhibits an electrical mechanical conversion function, for example, a piezoelectric element that is configured by interposing a piezoelectric body layer which is formed from a composite oxide having a perovskite type crystalline structure, between two electrodes. In this instance, producing a piezoelectric element by providing a buffer layer that is configured from an element that is capable of forming a B-site of the piezoelectric body layer, between a lower part electrode and the piezoelectric body layer, has been suggested (for example, refer to JP-A-2005-340428). In JP-A-2005-340428, Ti, Zn and Mg are included as examples of elements that are capable of forming a B-site, and the buffer layer is configured from these metal elements.

However, in recent years, there has been a state in which further increases in high density and high performance have been required in liquid ejecting heads, and it has been necessary to secure larger displacement. Additionally, in addition to just piezoelectric elements that are used in ink jet type recording heads, this kind of problem also applies in piezoelectric elements that are used in other liquid ejecting heads that eject liquids other than ink, and piezoelectric elements that are used in applications other than liquid ejecting heads.

SUMMARY

An advantage of some aspects of the invention is to provide a piezoelectric element, and a piezoelectric application device using the same that can achieve an improvement in displacement.

According to an aspect of the invention, there is provided a piezoelectric element including a first electrode, a piezoelectric body layer, a second electrode, and a seed layer formed between the first electrode and the piezoelectric body layer, the seed layer controls the piezoelectric body layer to be preferentially oriented with respect to a specific crystal plane. The seed layer is formed from a composite oxide with a perovskite structure that includes at least Bi, Sr, Fe and Ti. An element ratio of Bi, Sr, Fe, and Ti in the seed layer satisfies the Formula (1) below.

[Chem. 1]

$$Bi:Sr:Fe:Ti = x:(1-y):y:1-z:z \quad (1)$$

$(1.0 \leq x < 1.3, 0 < y < 0.4, 0.4 \leq z \leq 0.6)$

According to the aspect, it is possible to perform orientation control of the piezoelectric body layer using the seed layer that is formed from a composite oxide with the abovementioned perovskite structure, and therefore, it is possible to achieve an improvement in displacement.

Here, in the Formula (1), it is preferable that $1.0 \leq x \leq 1.22$, $0.1 \leq y \leq 0.3$, $0.4 \leq z \leq 0.6$ are satisfied. As a result of this, it is possible to perform orientation control of the piezoelectric body layer more suitably using the seed layer, and therefore, it is possible to achieve an improvement in displacement.

In addition, it is preferable that a preferential orientation axis of the piezoelectric body layer forms an angle that is greater than or equal to 0° and less than 20° with respect to a film thickness direction of the piezoelectric body layer. As a result of this, it is possible to perform orientation control of the piezoelectric body layer still more suitably using the seed layer, and therefore, it is possible to achieve an improvement in displacement.

In addition, it is preferable that an absolute value of a diffraction angle of a peak center, which is obtained through (100) plane X-ray inverse lattice mapping of the crystal of the piezoelectric body layer, is within a range of 5° to 12°. As a result of this, it is possible to perform orientation control of the piezoelectric body layer still more suitably using the seed layer, and therefore, it is possible to achieve an improvement in displacement.

According to another aspect of the invention, there is provided a piezoelectric application device including any one of the abovementioned piezoelectric elements. According to the aspect, since the liquid ejecting head is provided with the abovementioned piezoelectric element, it is possible to achieve an improvement various characteristics of the piezoelectric application device.

BRIEF DESCRIPTION OF THE DRAWINGS

The invention will be described with reference to the accompanying drawings, wherein like numbers reference like elements.

FIGS. 12A to 12C are two-dimensional mapping photographs that show X-ray diffraction strengths.

FIGS. 13A and 13B are two-dimensional mapping photographs that show X-ray diffraction strengths.

DESCRIPTION OF EXEMPLARY EMBODIMENTS

Embodiment 1

Figure 1:
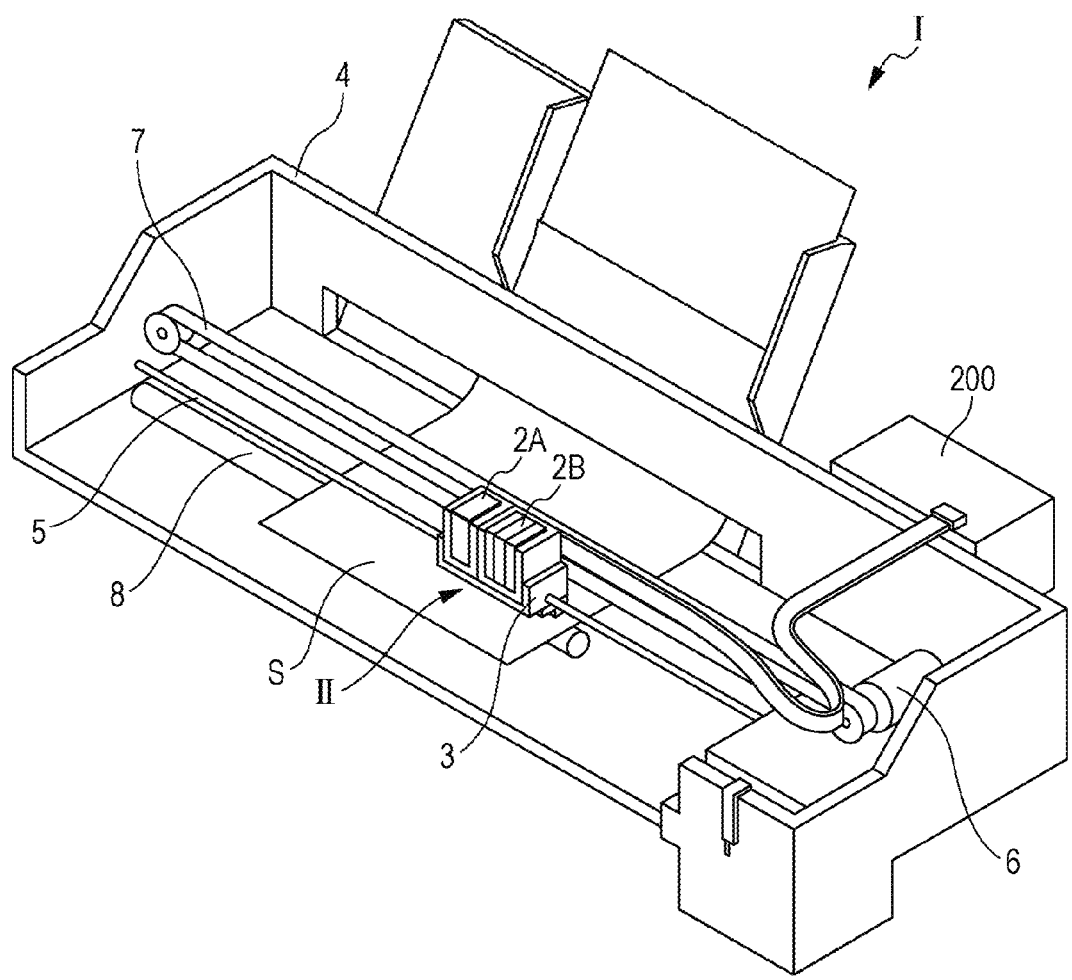
FIG. 1 is a view that shows a schematic configuration of a recording apparatus according to Embodiment 1.

FIG. 1 is an ink jet type recording apparatus, which is an example of a liquid ejecting apparatus according to Embodiment 1 of the invention.

As illustrated in the drawing, in an ink jet type recording apparatus I, cartridges 2A and 2B, which configure an ink supply means, are provided in a detachable manner in an ink jet type recording head unit II (head unit) that has a plurality of ink jet type recording heads. A carriage 3, in which the head unit II is installed, is provided on a carriage shaft 5, which is attached to an apparatus main body 4, in a manner in which the carriage 3 is movable in an axial direction, and for example, is set to respectively discharge a black ink composition and a color ink composition.

Further, the carriage 3, in which the head unit II is installed, is moved along the carriage shaft 5 as a result of a driving force of a driving motor 6 being transmitted to the carriage 3 via a plurality of gear wheels that are not shown in the drawings and a timing belt 7. Meanwhile, a transport roller 8 is provided in the apparatus main body 4 as transport means, and recording sheets S, which are a recording medium such as paper, are transported by the transport roller 8. Additionally, the transport means that transports the recording sheets S is not limited to a transport roller, and may be a belt, a drum or the like.

According to the abovementioned ink jet type recording apparatus I, since an ink jet type recording head that uses a piezoelectric element according to the present embodiment is installed as an ink jet type recording head, excellent ejection characteristics are achieved.

Figure 2:
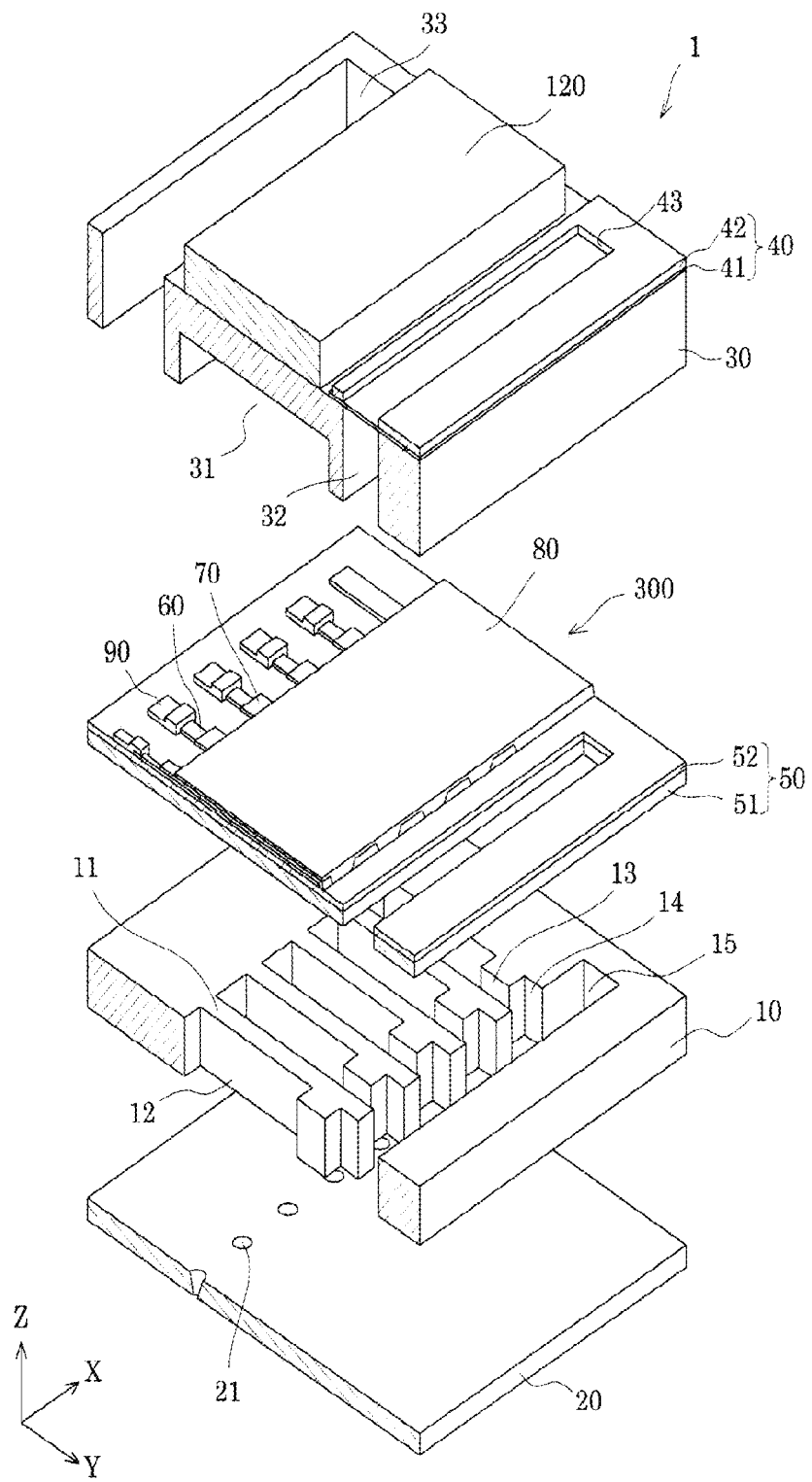
FIG. 2 is an exploded perspective view that shows a recording head according to Embodiment 1.
Figure 3A:
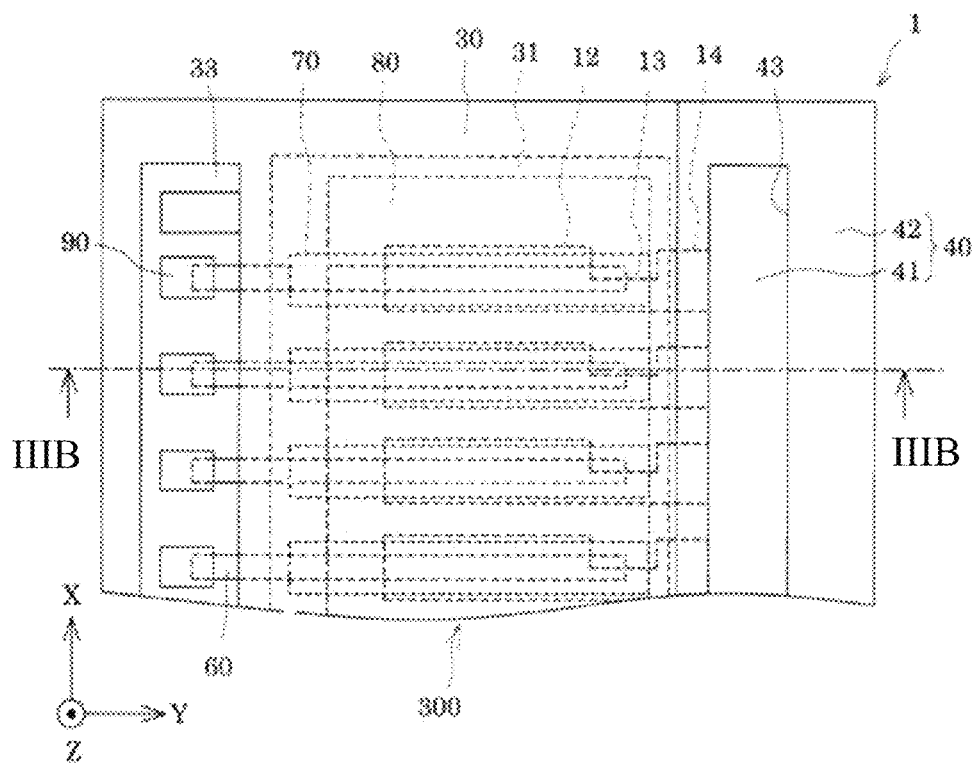
FIG. 3A is a plan view that shows the recording head according to Embodiment 1.
Figure 3B:
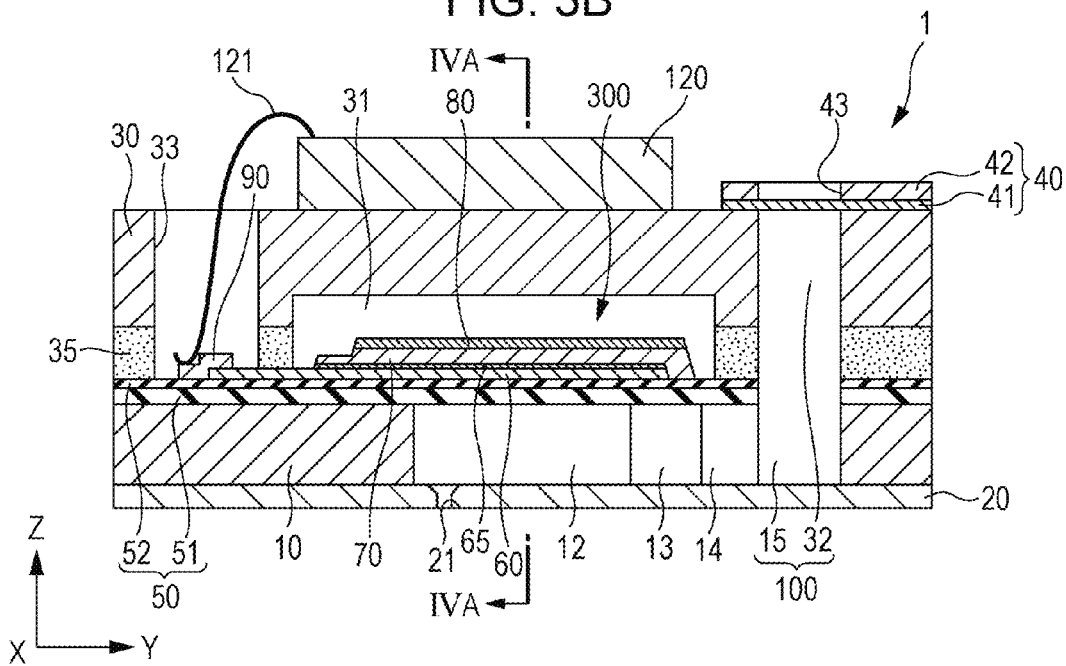
FIG. 3B is a cross-sectional view that shows the recording head according to Embodiment 1.

An example of an ink jet type recording head 1 that is installed in this kind of ink jet type recording apparatus I will be described with reference to FIGS. 2 to 3. FIG. 2 is an exploded perspective view of an ink jet type recording head, which is an example of a liquid ejecting head according to Embodiment 1 of the invention. FIG. 3(a) is a plan view of a piezoelectric element side of a flow channel forming substrate, and FIG. 3(b) is a cross-sectional view that corresponds to a line A-A' in FIG. 3(a).

As illustrated in the drawing, pressure generation chambers 12 are formed in a flow channel forming substrate 10. Further, the pressure generation chambers 12, which are partitioned by a plurality of dividing walls 11, are arranged in parallel along a direction in which a plurality of nozzle openings 21, which discharge ink of the same color, are arranged in parallel. Hereinafter, an arrangement direction of the pressure generation chambers 12 in the flow channel forming substrate 10 will be referred to as a width direction, or as a first direction X, and a direction that is orthogonal to the first direction X will be referred to as a second direction Y. In addition, a direction that is orthogonal to the first direction X and the second direction Y will be referred to as a thickness direction or a third direction Z.

Ink supply channels 13 that reduce an opening area by constricting a side of the pressure generation chamber 12 from the first direction X, and communication channels 14 that have substantially the same width in the first direction X as the pressure generation chambers 12, are partitioned at an end part side in the second direction Y of the pressure generation chambers 12 of the flow channel forming substrate 10 by the plurality of dividing walls 11. A communication portion 15, which configures a portion of a manifold 100, which is a common ink chamber of each pressure generation chamber 12, is formed on an outer side of the communication channels 14 (a side that is opposite to the pressure generation chambers 12 in the second direction Y). That is, a liquid flow channel that is formed from the pressure generation chambers 12, the ink supply channels 13, the communication channels 14, and the communication portions 15 is formed in the flow channel forming substrate 10.

A nozzle plate 20, through which the nozzle openings 21, which are in communication with each pressure generation chamber 12, penetrate, is joined to a first surface side of the flow channel forming substrate 10, that is, a surface at which the liquid flow channel of the pressure generation chambers 12 and the like is open, using an adhesive, a heat welding film or the like. The nozzle openings 21 are arranged in parallel on the nozzle plate 20 in the first direction X.

A vibration plate 50 is formed on a second surface side that faces the first surface side of the flow channel forming substrate 10. For example, the vibration plate 50 can be configured by an elastic film 51 that is provided on the flow channel forming substrate 10, and an insulating body film 52 that is provided on the elastic film 51. However, the vibration plate 50 is not limited to the abovementioned example, and it is also possible to use a portion of the flow channel forming substrate 10 as an elastic film by performing a thinning treatment thereon.

A piezoelectric element 300, which is configured by a first electrode 60 with a thickness of approximately 0.2 μm, a piezoelectric body layer 70 with a thickness of approximately less than or equal to 3.0 μm, and preferably a thickness of approximately 0.5 μm to 1.5 μm, and a second electrode 80 with a thickness of approximately 0.05 μm using a cohesion layer (not shown in the drawings) that is formed from titanium, for example, is formed on the insulating body film 52. However, it is possible to omit the cohesion layer.

In the present embodiment, the piezoelectric element 300 and the vibration plate 50, in which displacement is caused as a result of driving of the piezoelectric element 300, are referred to collectively as an actuator device. In addition, the vibration plate 50 and the first electrode 60 act as a vibration plate, but the configuration is not limited to this. A configuration in which either one of or both of the elastic film 51 and the insulating body film 52 are not provided, and the first electrode 60 only acts as a vibration plate may also be used. In addition, a configuration in which the piezoelectric element 300 itself also effectively includes a function of a vibration plate may also be used. In a case in which the first electrode 60 is directly provided on the flow channel forming substrate 10, it is preferable to protect the first electrode 60 with an insulating protective film or the like so that there is no conduction between the first electrode 60 and ink.

In this kind of piezoelectric element 300, generally, either one of the electrodes is set as a common electrode, and the other electrode is set as an individual electrode through patterning for each pressure generation chamber 12. In the present embodiment, the first electrode 60 is set as an individual electrode and the second electrode 80 is set as a common electrode, but this configuration may be reversed for the convenience of a driving circuit 120 or connection wiring 121. In the present embodiment, the second electrode 80 is set as the common electrode by being formed continuously across a plurality of pressure generation chambers 12.

The second electrode 80 is provided on a surface side of the piezoelectric body layer 70 that is opposite to the first electrodes 60. The material of the abovementioned first electrodes 60 and the second electrode 80 is not particularly limited as long as the material is conductive, and the use of a precious metal such as platinum (Pt) or iridium (Ir) is preferable.

A protective substrate 30, which includes a manifold portion 32 that configures at least a portion of a manifold 100 is joined to the flow channel forming substrate 10 on which the piezoelectric element 300 is formed, that is, to the vibration plate 50, the first electrodes 60 and lead electrodes 90 using an adhesive 35. In the present embodiment, the manifold portion 32 is formed across the entirety of a width direction of the pressure generation chambers 12 by penetrating the protective substrate 30 in a thickness direction, and the manifold 100 that forms an ink chamber that is common to each pressure generation chamber 12 by being in communication with the communication portion 15 of the flow channel forming substrate 10 in the manner mentioned above, is configured. In addition, a configuration in which only the manifold portion 32 is used as the manifold may be set by dividing the communication portion 15 of the flow channel forming substrate 10 into a plurality of portions for each pressure generation chamber 12. Furthermore, for example, a configuration in which only the pressure generation chambers 12 are provided in the flow channel forming substrate 10, and the ink supply channels 13, which are in communication with the manifold and each pressure generation chamber 12, are provided in the elastic film 51 and the insulating body film 52, which are interposed between the flow channel forming substrate 10 and the protective substrate 30, may also be used.

A piezoelectric element retention portion 31 that includes a space that is of an extent that does not disturb the movement of the piezoelectric element 300 is provided in the protective substrate 30 in a region that faces the piezoelectric element 300. Additionally, it is suitable as long as a configuration in which the piezoelectric element retention portion 31 has a space that is of an extent that does not disturb the movement of the piezoelectric element 300, and the space may be sealed or may not be sealed. The driving circuit 120, which functions as a signal processing unit is fixed onto the protective substrate 30. For example, the driving circuit 120 can use a circuit board, a semiconductor integrated circuit (IC) or the like, and is connected to a printer controller (200 in FIG. 1). The driving circuit 120 and the lead electrode 90 can be electrically connected via connection wiring 121 that is formed from conductive wire such as bonding wire that is inserted through a through hole 33.

In addition, a compliance substrate 40 that is formed from a sealing film 41 and a fixing plate 42 is joined to the protective substrate 30. The sealing film 41 is formed from a material with low rigidity, and a surface of the manifold portion 32 is sealed using the sealing film 41. In addition, the fixing plate 42 can be configured using a hard material such as a metal. Since a region of the fixing plate 42 that faces the manifold 100 forms an open portion 43 in which the fixing plate 42 has been completely removed in the thickness direction, a surface of the manifold 100 is sealed by the flexible sealing film 41.

Figure 4A:
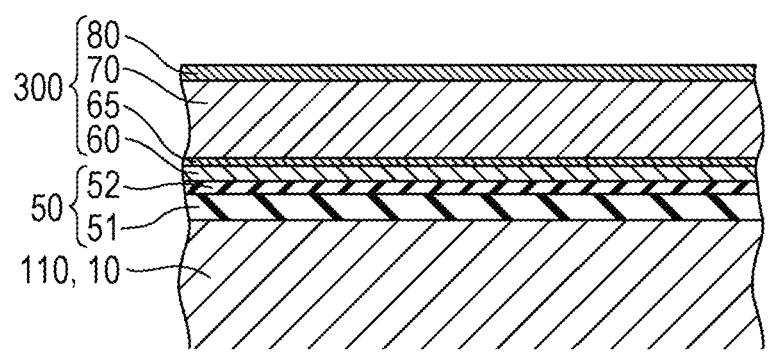
FIGS. 4A and 4B are views that describe a piezoelectric element according to Embodiment 1.
Figure 4B:
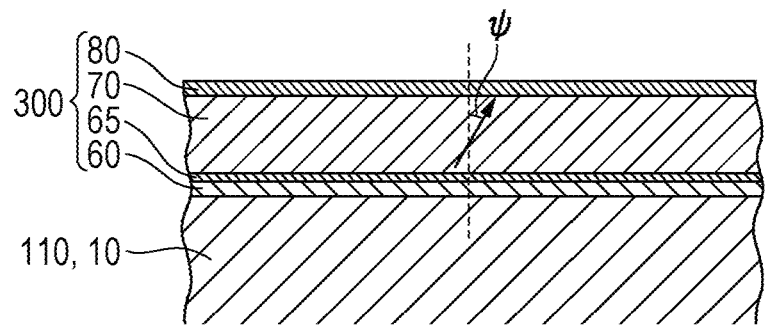

In this instance, a piezoelectric element according to the present embodiment will be described using FIGS. 4(a) and 4(b). FIG. 4(a) is an expanded cross-sectional view that corresponds to a line B-B' in FIG. 3(b), and FIG. 4(b) is a view that describes an inclination of a preferential orientation axis of the piezoelectric body layer.

In the piezoelectric element 300 of the present embodiment, a seed layer 65, which performs control such that the piezoelectric body layer 70 is preferentially oriented with respect to a specific crystal plane, is formed between the first electrode 60 and the piezoelectric body layer 70, and the seed layer 65 is configured so as to be formed from a composite oxide with a perovskite structure that includes at least Bi, Sr, Fe and Ti. As a result of this, since electric field loss decreases in the piezoelectric body layer 70 due to an excellent dielectric constant of the seed layer 65, it is possible to improve a piezoelectric characteristic, and therefore, it is possible to achieve an improvement in displacement.

The piezoelectric body layer 70 is configured by a non-lead-based material, and in this instance, is configured so as to include bismuth (Bi) and iron (Fe). As a result of this, a piezoelectric body layer 70 that is formed from a composite oxide with a bismuth ferrite (BFO)-based perovskite structure that includes Bi and Fe, is formed, and it is possible to realize a piezoelectric element 300 that can reduce an environmental load.

In this kind of composite oxide with a perovskite type structure, an A site is in 12-fold coordination with oxygen atoms and a B site is in 6-fold coordination with oxygen atoms forming an octahedron. A composite oxide in which a portion of the Bi at the A site or Fe at the B site has been substituted with various elements may be used. For example, it is possible to set a configuration in which the piezoelectric body layer 70 includes at least one element selected from a group that is formed from lanthanum (La), manganese (Mn) or titanium (Ti). As a result of this, for example, a leakage current is reduced in a circumstance in which a non-lead-based material is used, and therefore, it is possible to improve the reliability of the piezoelectric element 300.

It is possible to include La as an example of element that can be substituted with the Bi at the A site, and Mn as an example of element that can be substituted with the Fe at the B site. This kind of composite oxide is referred to as bismuth lanthanum ferrite manganate (BLFM), is represented by the following compositional formula (2), and the piezoelectric body layer 70 is configured by BLFM in the present embodiment.

[Chem. 2]

$$(Bi_{1-a},La_a)(Fe_{1-b},Mn_b)O_3 \quad (2)$$

(In the formula, a and b both have values that are larger than 0 but less than 1)

As the piezoelectric body layer 70, it is possible to use BLFMT in which the Fe at the B site of BLFM has been substituted with Ti. This kind of composite oxide is represented by the following compositional formula (3).

[Chem. 3]

$$(Bi_{1-a},La_a)(Fe_{1-b-c},Mn_b,Ti_c)O_3 \quad (3)$$

(In the formula, a, b, and c all have values that are larger than 0 but less than 1)

As the piezoelectric body layer 70, it is possible to use a composite oxide in which the La at the A site of the BLFMT in compositional formula (3) has been substituted with Ba. This kind of composite oxide is represented by the following compositional formula (4).

[Chem. 4]

$$(Bi_{1-a},Ba_a)(Fe_{1-b-c},Mn_b,Ti_c)O_3 \quad (4)$$

(In the formula, a, b, and c all have values that are larger than 0 but less than 1)

The Bi at the A site of the piezoelectric body layer 70 may be substituted with samarium (Sm), cerium (Ce) or the like, and the Fe at the B site may be substituted with aluminum (Al), cobalt (Co) or the like. Even in a case of a composite oxide that includes these other elements, it is preferable to configure such that the composite oxide has a perovskite structure.

In this manner, as the piezoelectric body layer 70, it is possible to exemplify bismuth ferrite ($BiFeO_3$), bismuth ferrite aluminum ($Bi(Fe, Al)O_3$), bismuth ferrite manganese ($Bi(Fe, Mn)O_3$), bismuth lanthanum ferrite manganate ((Bi, La) (Fe, Mn)$O_3$), bismuth ferrite cobaltate (Bi(Fe, Co)$O_3$), bismuth cerium ferrite ((Bi, Ce)Fe$O_3$), bismuth cerium ferrite manganate ((Bi, Ce) (Fe, Mn)$O_3$), bismuth lanthanum cerium ferrite ((Bi, La, Ce)Fe$O_3$), bismuth lanthanum cerium ferrite manganate ((Bi, La, Ce) (Fe, Mn)$O_3$), bismuth samarium ferrite ((Bi, Sm)Fe$O_3$), bismuth ferrite chromate (Bi(Cr, Fe)$O_3$), bismuth sodium titanate ((Bi, Na)Ti$O_3$), bismuth potassium titanate ((Bi, K)Ti$O_3$), barium titanate (BaTi$O_3$), potassium sodium niobate ((K, Na) Nb$O_3$) and the like. In addition, the piezoelectric body layer 70 may also be a mixed crystal system of these materials. It is also possible to realize a piezoelectric element 300 that can reduce an environmental load using these non-lead-based materials.

The piezoelectric body layer 70 is not limited to a non-lead-based material, and can use lead titanate (PbTi$O_3$), lead zirconate titanate (Pb(Zr, Ti)$O_3$) or the like. As a result of this, it becomes easier to obtain a piezoelectric element that has an excellent piezoelectric characteristic. In this manner, the configuration of the piezoelectric body layer 70 is not limited to abovementioned examples, and naturally, inevitable changes in composition due to lattice mismatching, oxygen deficiency and the like, are permitted within a range in which a perovskite structure can be understood. For example, if a stoichiometric ratio is set as 1, a value within a range of 0.85 to 1.20 is permitted.

This kind of piezoelectric body layer 70 is configured to be preferentially oriented with respect to a specific crystal plane by performing orientation control using the seed layer 65 therebelow. In the present embodiment, the piezoelectric body layer 70 is configured so that a preferential orientation axis of the piezoelectric body layer 70 forms a predetermined angle φ with respect to a film thickness direction thereof, and therefore, a circumstance in which it is easier to achieve an improvement in displacement is attained. Additionally, in the present disclosure, the preferential orientation is not limited to a case in which the entire crystal of the piezoelectric body layer 70 is oriented in a specific direction, and includes a case in which the majority of the crystal (for example, greater than or equal to 80%) is oriented.

Next, the seed layer 65 is configured to be formed between the abovementioned piezoelectric body layer 70 and first electrode 60, and to be formed from a composite oxide with a perovskite structure that includes at least bismuth (Bi), strontium (Sr), iron (Fe) and titanium (Ti). The composite oxide is represented by the following compositional formula (5). In the present embodiment, the seed layer 65 is provided with an orientation control function that causes the crystal of the piezoelectric body layer 70 to be preferentially oriented to the (100) plane.

[Chem. 5]

$$(Bi,Sr)(Fe,Ti)O_3 \qquad (5)$$

An element ratio of Bi, Sr, Fe, and Ti in the seed layer 65 is set to satisfy the formula (1) below. In the formula, x represents a Bi amount, which may be added to excess, for example, if x=1.1, 110% of the Bi when (1−y) is set to 100% is included. However, Bi need not necessarily be added to excess.

[Chem. 6]

$$Bi:Sr:Fe:Ti = x \cdot (1-y) : y : 1-z : z \qquad (1)$$

(1.0≤x<1.3, 0<y<0.4, 0.4≤z≤0.6)

More preferable range is 1.0≤x<1.22, 0.1≤y≤0.3, 0.4≤z≤0.6. For y, the range of 0.15<y<0.25 is particularly preferable. In addition, it is preferable that Fe/Ti((1−z)/z) is 0.67≤Fe/Ti<1.5. It is more preferable that 0.67≤Fe/Ti<1.5 and it is far more preferable that 0.67≤Fe/Ti≤1.0.

An oxide in which a portion of the Bi, Sr, Fe and Ti is substituted with other elements within a range that does not hinder the function of the seed layer 65, may also be set. For example, in addition to Bi and Sr, an element such as Ba or La may also be present at the A site, and in addition to Fe and Ti, an element such as Zr or Nb may also be present at the B site. In addition, naturally, inevitable changes in composition due to lattice mismatching, oxygen deficiency and the like, are permitted within a range in which a perovskite structure can be understood. For example, if a stoichiometric ratio is set as 1, a value within a range of 0.85 to 1.20 is permitted.

A film thickness of the seed layer 65 can be selected as appropriate depending on the application or the like of the piezoelectric element 300, and for example, is set to a level that is advantageous with respect to miniaturization and increases in high density of the piezoelectric element 300 through thinning in the same manner as the piezoelectric body layer 70. As one example, the film thickness of the seed layer 65 can be set to 20 nm to 80 nm, and preferably 20 nm to 50 nm. In addition, the seed layer 65 may have an island shape instead a layer shape.

Next, an example of a production method of the piezoelectric element of the present embodiment will be described in combination with an example of a production method of the recording head of the present embodiment in which the piezoelectric element is installed with reference to FIGS. 5 to 6.

Firstly, the vibration plate 50 is formed on the surface of a flow channel forming substrate wafer 110, which is a silicon wafer. In the present embodiment, a vibration plate 50 that is formed from a lamination of a silicon dioxide (the elastic film 51), which is formed through thermal oxidation of the flow channel forming substrate wafer 110, and zirconium oxide (the insulating body film 52), which is formed through thermal oxidation after film formation using a sputtering method. In the present embodiment, a configuration in which a cohesion layer (not shown in the drawings) is further formed on the vibration plate 50, is used, but it is possible to omit the cohesion layer.

Figure 5A:
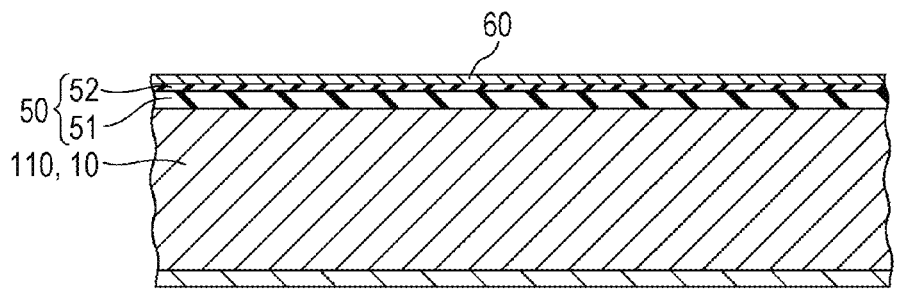
FIGS. 5A to 5C are views that show a production example of the piezoelectric element and the recording head according to Embodiment 1.

Next, as shown in FIG. 5(a), the first electrode 60 is formed over the entire surface of the cohesion layer on the vibration plate 50. For example, it is possible to form the first electrode 60 using a sputtering method or a PVD method (a physical vapor deposition method), gas phase film formation such as a laser ablation method, liquid phase film formation such as a spin coating method or the like. Next, the seed layer 65 and the piezoelectric body layer 70 are formed on the first electrode 60. The formation method of the seed layer 65 and the piezoelectric body layer 70 is not limited, but, for example, it is possible to produce the piezoelectric body layer 70 using a chemical solution method such as an MOD (Metal-Organic Decomposition) method or a sol-gel method that obtains a piezoelectric body layer that is formed from a metal oxide by coating and drying a solution that includes metal complexes, and firing the solution at a high temperature. In addition, it is also possible to produce the piezoelectric body layer 70 with a liquid phase method or a solid phase method such as a laser ablation method, a sputtering method, a pulse-laser-deposition method (a PLD method), a CVD method, or an aerosol-deposition method.

A specific formation sequence example of a case in which the seed layer 65 and the piezoelectric body layer 70 are formed using a chemical solution method is as follows. That is, a precursor solution for forming the seed layer 65, which is formed from an MOD solution or a sol that includes metal complexes is created. Further, a precursor film is formed by coating the first electrode 60 with the precursor solution using a spin coating method or the like (a coating process). The precursor film is heated to a predetermined temperature and is dried for a fixed time (a drying process), and the dried precursor film is degreased by further heating to a predetermined temperature and retaining for a fixed time (a degreasing process). The seed layer 65 is formed through crystallization of the precursor film as a result of heating to a predetermined temperature and retaining (a firing process).

The solution that is applied in the coating process is a solution in which metal complexes that are capable of forming a composite oxide precursor film that includes Bi, Sr, Fe and Ti are mixed by firing, and the mixed product is dissolved or dispersed in an organic solvent. It is possible to include bismuth 2-ethyl hexanoate, bismuth acetate or the like as an example of a metal complex that includes Bi. It is possible to include strontium 2-ethyl hexanoate or the like as an example of a metal complex that includes Sr. It is possible to include iron 2-ethylhexanoate, iron acetate, tris(acetylacetonato) iron or the like as an example of a metal complex that includes Fe. For example, it is possible to include titanium 2-ethyl hexanoate or the like as an example of a metal complex that includes Ti.

In the present embodiment, a seed layer 65 that is formed from one layer is formed by performing the coating process once, but a seed layer that is formed from a plurality of layers may be formed by repeating the abovementioned steps from the coating process to the firing process that relate to the seed layer 65 a plurality of times.

Figure 5B:
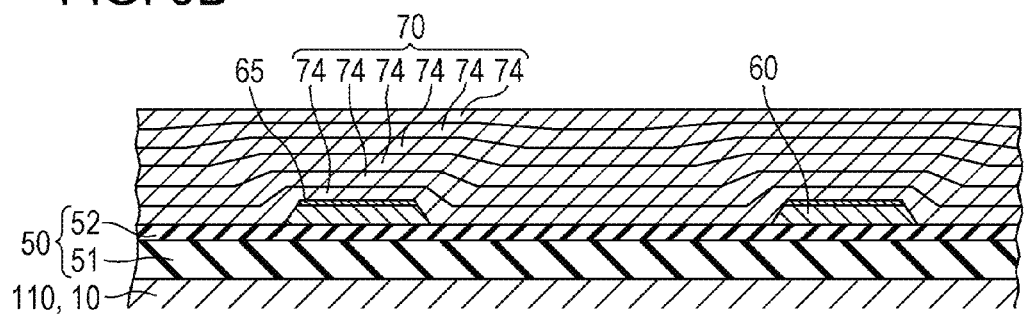

Thereafter, as shown in FIG. 5(b), the first electrode 60 and the seed layer 65 are simultaneously patterned so that side surfaces thereof are inclined. Additionally, the patterning in this instance can, for example, be performed through reactive ion etching (RIE), dry etching such as ion milling or the like. Further, a plurality of precursor films 74 are formed on the seed layer 65 by repeating the abovementioned coating process, drying process, degreasing process and firing process a plurality of times.

Figure 5C:
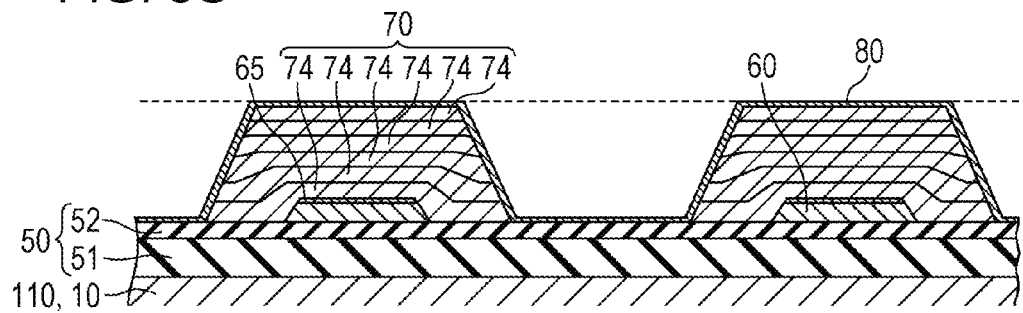

After the piezoelectric body layer 70 is formed, the second electrode 80, which is formed from platinum or the like, is formed on the piezoelectric body layer 70 using a sputtering method or the like, and as shown in FIG. 5(c), a piezoelectric element 300 that is formed from the first electrode 60, the piezoelectric body layer 70, and the second electrode 80 is formed by simultaneously patterning the piezoelectric body layer 70 and the second electrode 80 in a region that faces each pressure generation chamber 12.

Figure 6A:
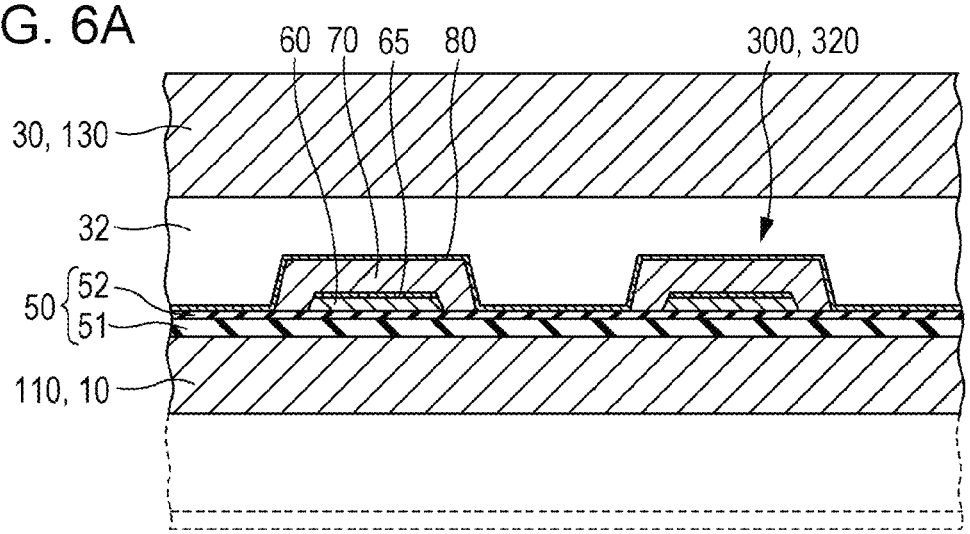
FIGS. 6A to 6C are views that show a production example of the piezoelectric element and the recording head according to Embodiment 1.
Figure 6B:
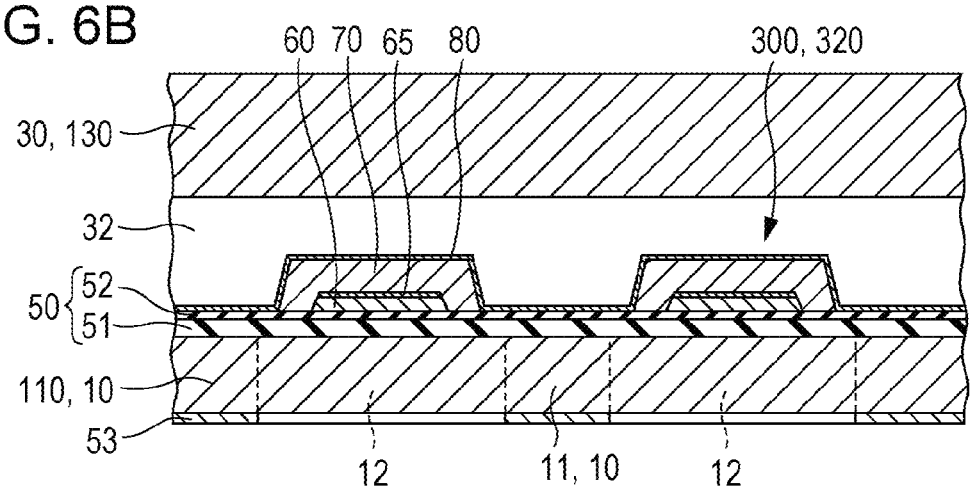
Figure 6C:
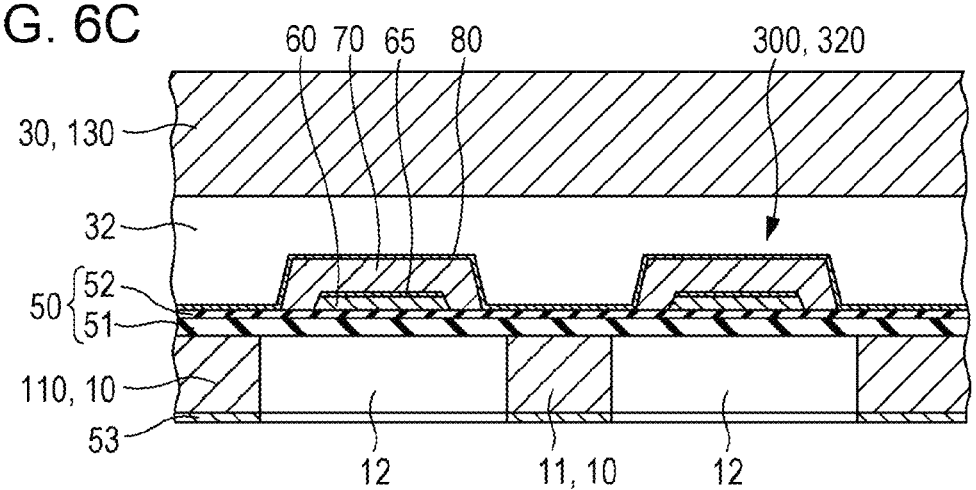

Thereafter, as shown in FIG. 6(a), after a protective substrate wafer 130, which is a silicon wafer and serves as a plurality of protective substrates 30, is bonded to a piezoelectric element 300 side of the flow channel forming substrate wafer 110, the flow channel forming substrate wafer 110 is thinned to a predetermined thickness. Further, as shown in FIG. 6(b), a mask film 53 is newly formed on the flow channel forming substrate wafer 110 and is patterned in a predetermined shape. As shown in FIG. 6(c), the pressure generation chambers 12 that correspond to the piezoelectric element 300 are formed by performing anisotropic etching (wet etching) of the flow channel forming substrate wafer 110 using an alkali solution such as a KOH via the mask film 53.

Subsequently, in accordance with ordinary methods, unnecessary portions of the outer peripheral edge portions of the flow channel forming substrate wafer 110 and the protective substrate wafer 130 are removed by cutting using dicing or the like, for example. Further, after removing the mask film 53 that is on a surface of a side of the flow channel forming substrate wafer 110 that is opposite to the protective substrate wafer 130, in addition to bonding the nozzle plate, in which the nozzle openings are drilled, the compliance substrate is bonded to the protective substrate wafer 130, and the recording head is completed by dividing by the flow channel forming substrate wafer 110 and the like into flow channel forming substrates 10 with a single chip size such as that shown in FIG. 2.

EXAMPLES

Hereinafter, examples will be shown and the invention will be described more specifically. Additionally, the invention is not limited to the examples mentioned below.

Example 1

Provision of Substrate

Firstly, a silicon (Si) substrate is oxidized thereby forming a silicon oxide ($SiO_2$) film on the surface thereof, and zirconium oxide ($ZrO_2$) is formed as the insulating body film 52 by sputtering a zirconium (Zr) film onto the $SiO_2$ film, and carrying out an oxidation process thereon in an oxidation furnace. Thereafter, a Zr film is formed on the $ZrO_2$ film as a cohesion layer, and the first electrode 60 that is formed from platinum (Pt) is formed on the cohesion layer.

Preparation of Piezoelectric Element

Firstly, an appropriate amount of a solution for the seed layer 65 is taken using a micropipette, and instilled onto a substrate that is set in a spin coater. After film formation using spin coating, an amorphous film is formed by baking on a hot plate at 180° C. for 3 minutes and 350° C. for 3 minutes, and the seed layer 65 is configured by firing at 700° C. for 5 minutes using a lamp annealing apparatus.

The solution for the seed layer 65 is prepared in the following manner. That is, each n-octane solution of bismuth 2-ethyl hexanoate, strontium 2-ethyl hexanoate, iron 2-ethylhexanoate, and titanium 2-ethyl hexanoate is mixed, and the solution for the seed layer 65 is made by mixing at proportions at which a molar ratio of Bi:Sr:Fe:Ti becomes 0.972:0.1:0.5:0.5.

Thereafter, a solution for the piezoelectric body layer that includes Ba, La, Fe and Mn is manufactured separately, an appropriate amount thereof is taken using a micropipette, and instilled onto a substrate that is set in a spin coater. After film formation using spin coating, an amorphous film is formed by baking on a hot plate at 180° C. for 3 minutes and 350° C. for 3 minutes, and a first layer of the precursor film 74 is configured by firing at 750° C. for 5 minutes using a lamp annealing apparatus. In the same manner, in order to laminate the precursor film 74, an appropriate amount of the solution for the piezoelectric body layer is taken using a micropipette, and instilled onto a substrate that is set in a spin coater. After film formation using spin coating, an operation that forms an amorphous film by baking on a hot plate at 180° C. for 3 minutes and 350° C. for 3 minutes is repeated twice, and the product is fired at 750° C. for 5 minutes using a lamp annealing apparatus. A piezoelectric body layer 70 that is formed from a total of six layers of the precursor film 74 is formed by repeating the steps from the coating process to the firing process five times. An iridium (Ir) layer is formed on the piezoelectric body layer 70 using a sputtering method, and this is set as the second electrode 80. The piezoelectric element according to Example 1 is prepared using the abovementioned process.

Examples 2 to 3

The piezoelectric elements according to Examples 2 to 3 are prepared using the same processes as Example 1 with the compositional ratio of the solution for the seed layer 65 set as the ratios that are shown in Table 1.

Comparative Examples 1 and 2

The piezoelectric elements according to Comparative Example 1 are prepared using the same processes as Example 1 with the compositional ratio of the solution for the seed layer 65 set as the ratios that are shown in Table 1. Except for the fact that the compositional ratio of the solution for the seed layer 65 is set as the ratio that is shown in Table 1, that is, a solution for the seed layer in which Sr is not blended, is used, the piezoelectric element according to Comparative Example 2 is prepared using the same processes as Example 1.

TABLE 1

|  | Bi:Sr:Fe:Ti<br>X * (1 − y):y:(1 − z):z | Bi<br>Excess x | Fe/Ti<br>(1 − z)/z | Piezoelectric<br>Body Layer<br>Orientation | Inclination Angle φ |
|---|---|---|---|---|---|
| Example 1 | 0.972:0.1:0.5:0.5 | 1.08 | 1.0 | (100) | 5 |
| Example 2 | 0.864:0.2:0.5:0.5 | 1.08 | 1.0 | (100) | 12 |
| Example 3 | 0.756:0.3:0.5:0.5 | 1.08 | 1.0 | (100) | 9 |
| Comparative Example 1 | 0.648:0.4:0.5:0.5 | 1.08 | 1.0 | Random | — |
| Comparative Example 2 | 1.08:0:0.5:0.5 | 1.08 | 1.0 | (100) | 0 |

Test 1
Inverse Lattice Mapping (100) plane X-ray inverse lattice mapping of the crystal of the piezoelectric body layer was performed for Examples 1 to 3 and Comparative Examples 1 and 2. FIGS. 7 to 8 respectively show the results of the measurement.

Figure 7A:
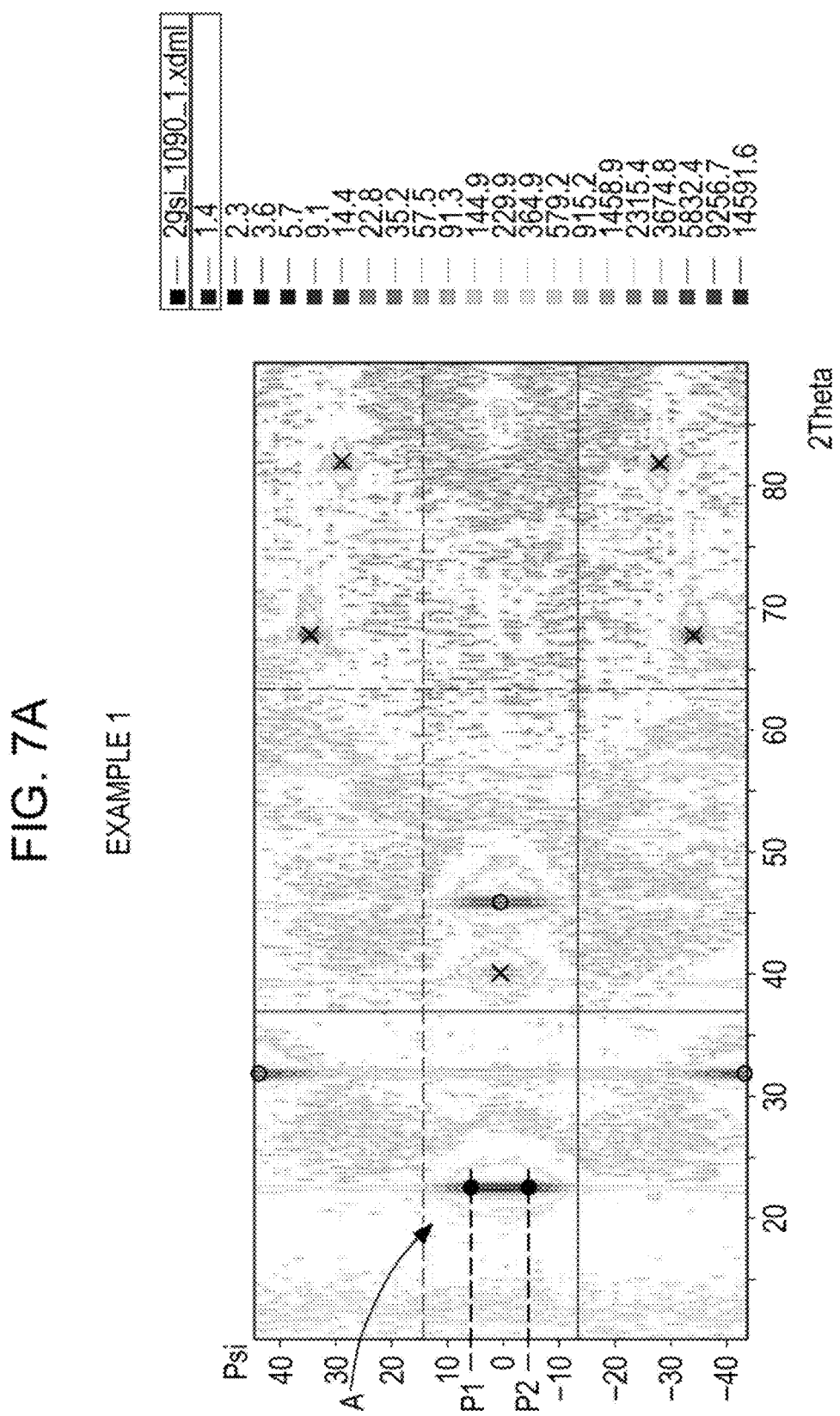
FIGS. 7A to 7C are (100) plane X-ray inverse lattice mapping views according to Examples 1 to 3.
Figure 7B:
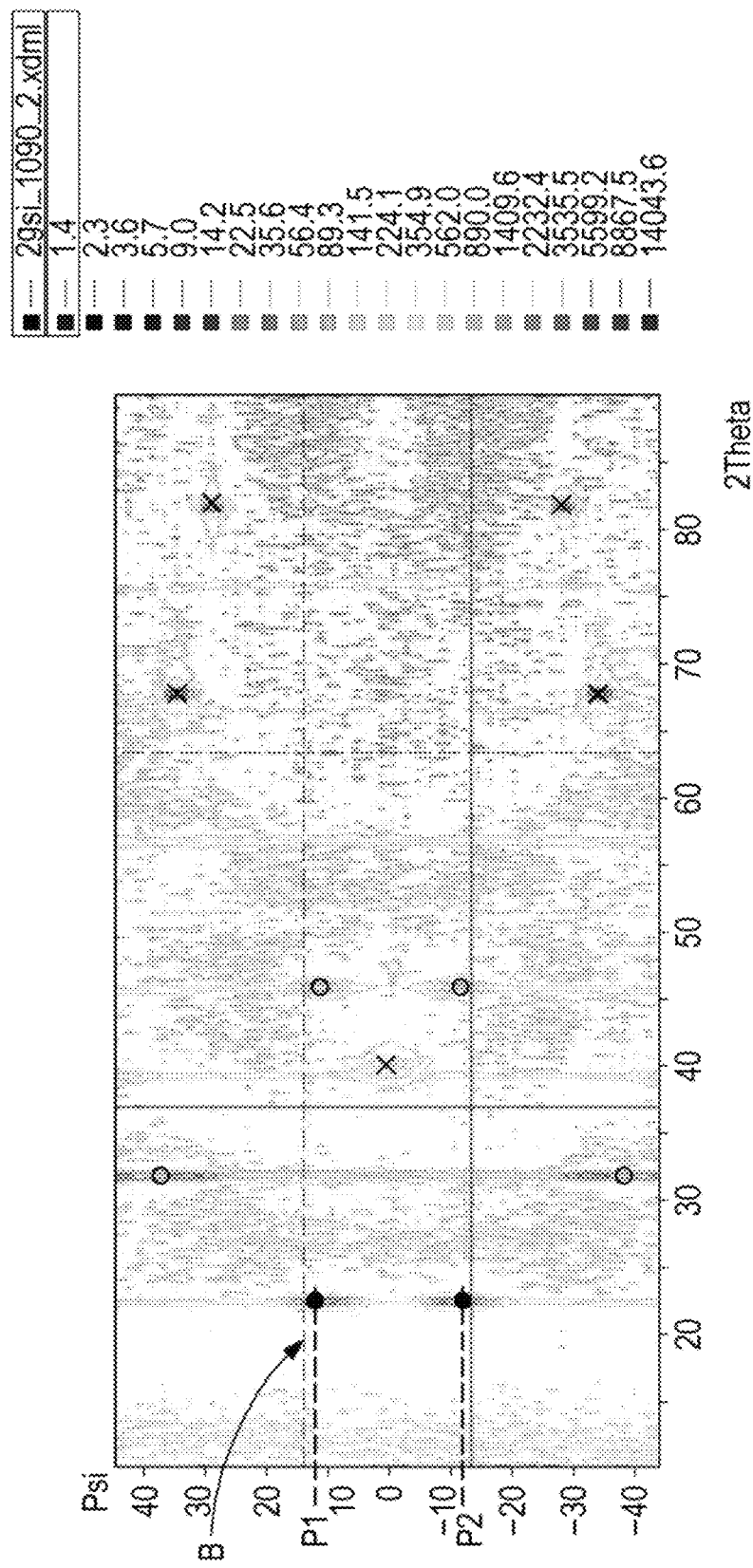
Figure 7C:
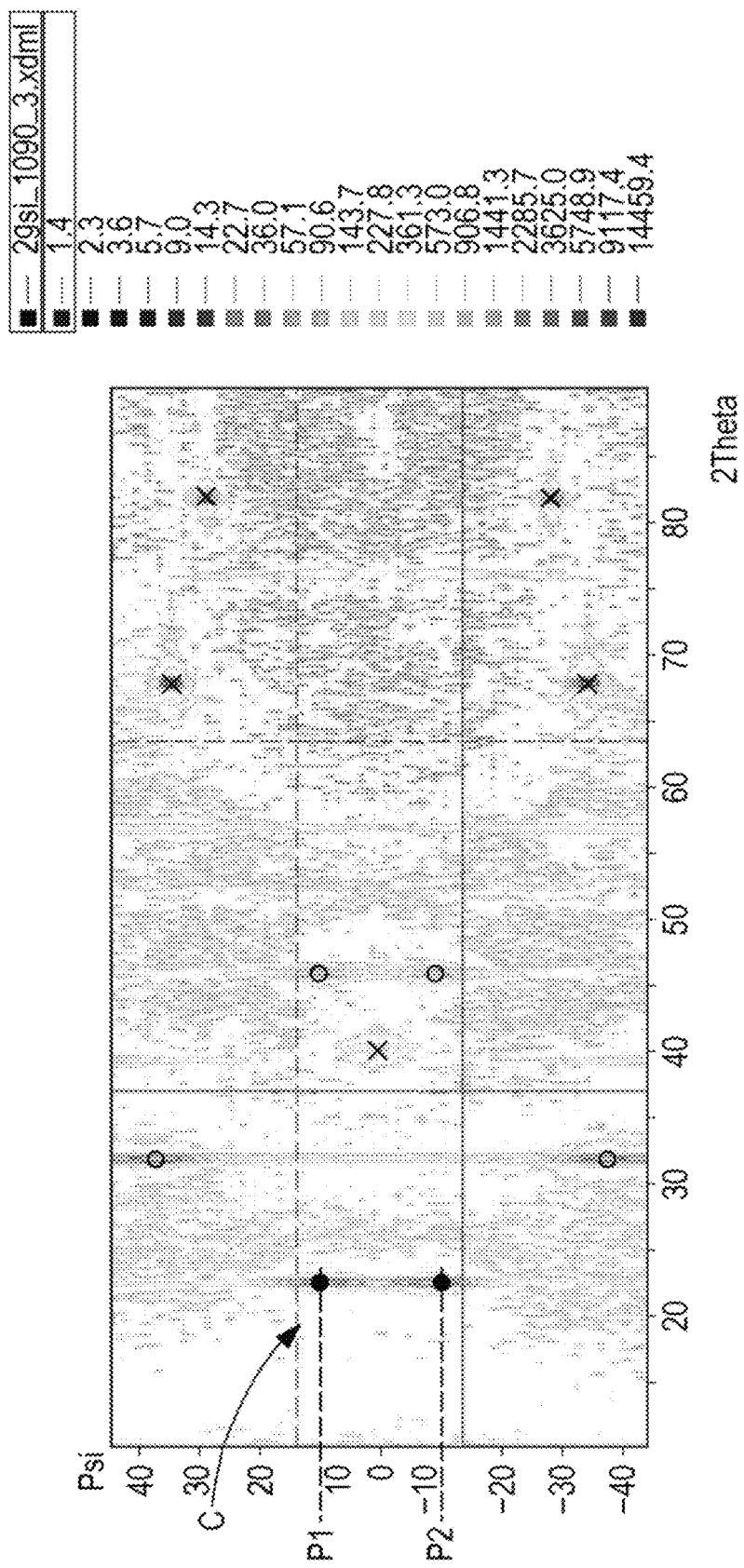
Figure 8A:
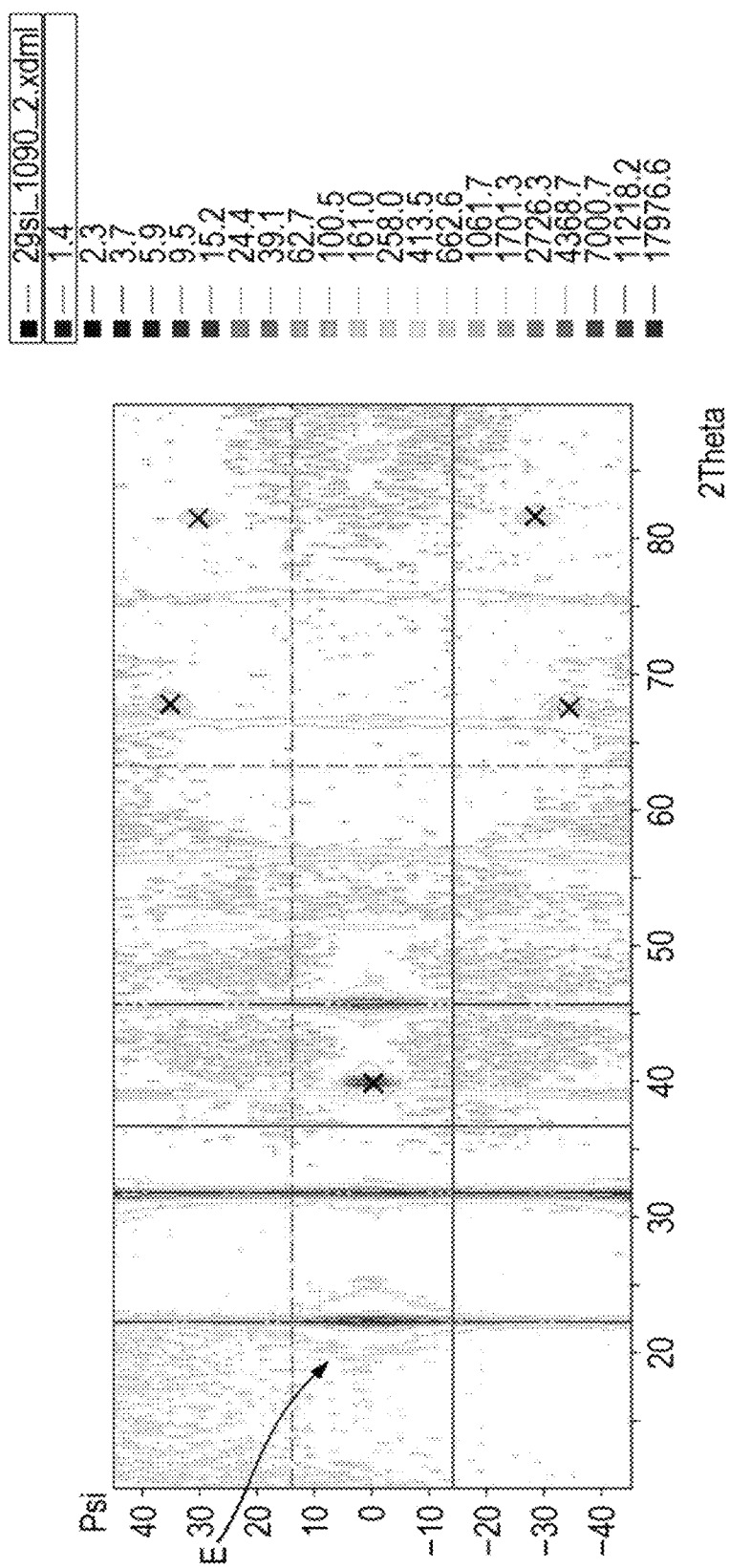
FIGS. 8A and 8B are (100) plane X-ray inverse lattice mapping views according to Comparative Examples 1 and 2.
Figure 8B:
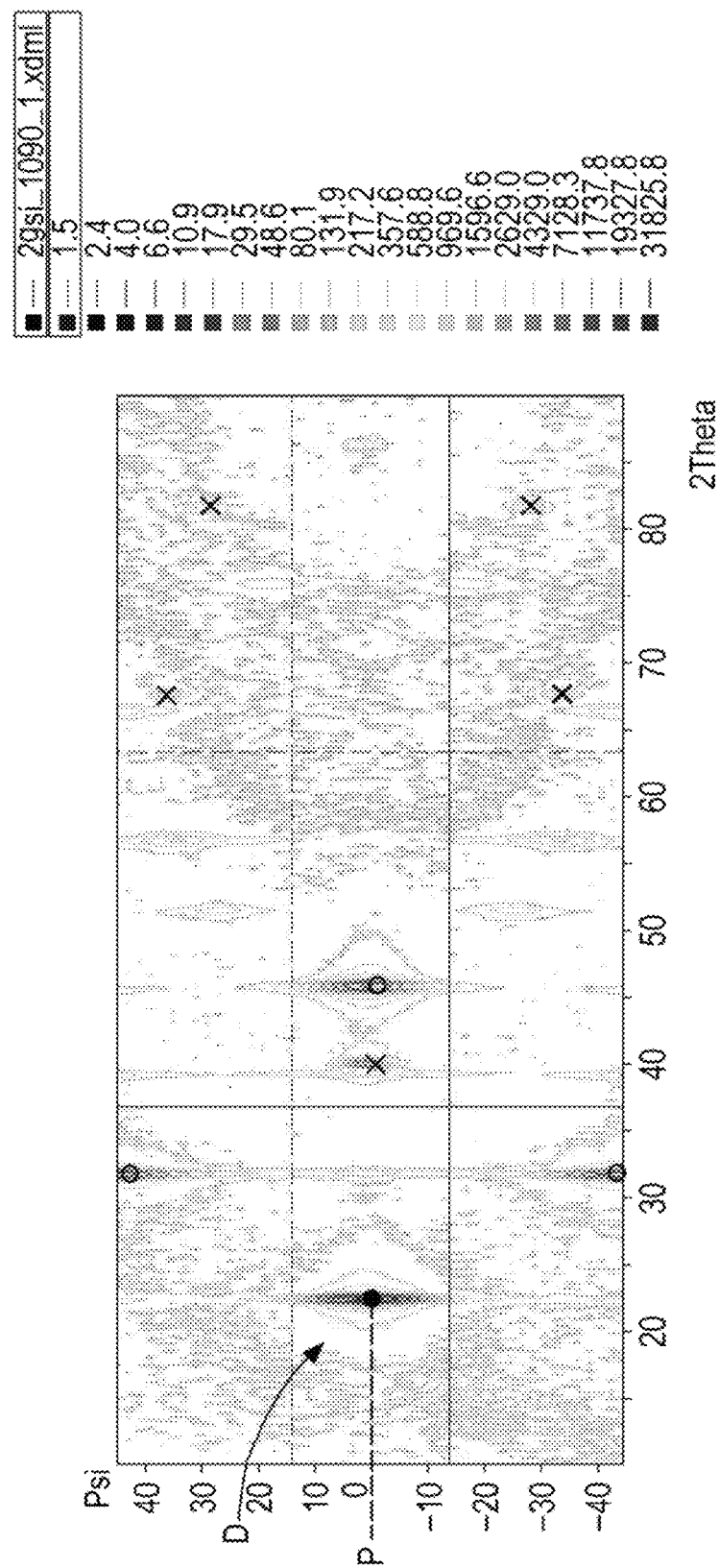

As shown by arrows A to C in FIG. 7, in Examples 1 to 3, a pair of strong peak is observed respectively at a position (FIG. 7(a)) of 2θ=22°, and φ=±5°, a position (FIG. 7(b)) of 2θ=20°, and φ=±12°, and a position (FIG. 7(c)) of 2θ=22°, and φ=±9°. As a result, in the Examples 1 to 3, it was confirmed that a preferential orientation axis of the piezoelectric body layer 70 formed an angle of 5°, 12°, and 9° with respect to the film thickness direction of the piezoelectric body layer 70, respectively. That is, it was understood that, in the Examples 1 to 3, the piezoelectric body layer 70 is oriented being inclined with an angle of 5°, 12°, and 9° with respect to the (100) plane respectively. In contrast to this, in Comparative Example 1 that is shown in FIG. 8(a), as shown by arrow E, a band-shaped peak was confirmed at a position of 2θ=22°. In Comparative Example 2 that is shown in FIG. 8(b), as shown by arrow D, the strongest peak center is only present in the vicinity of 0°, and division of the peak in the manner of Examples 1 to 3 was not observed in the Comparative Examples 1 and 2. As a Result of FIG. 8(a), in Comparative Example 1, it was confirmed that the piezoelectric body layer 70 is not oriented (random orientation). In addition, as a result of FIG. 8(b), in Comparative Example 2, is was confirmed that the preferential orientation axis of the piezoelectric body layer 70 is along the film thickness direction of the piezoelectric body layer 70, in other words, it was confirmed that the piezoelectric body layer 70 is oriented with respect to the (100) plane.

Description other than that described above shown in FIGS. 7(a) to 8(b) is as follows. First, according to the principle of measurement, a peak derived from the piezoelectric body observed at a position of 2θ=22° repeatedly presents at a position (value of φ is different from a case of position of 2θ=22°) in the vicinity of a position of 2θ=32°, and a position (value of φ is same as a case of position of 2θ=22°) in the vicinity of a position of 2θ=47°. ○ marks in FIGS. 7(a) to 7(c) and FIG. 8(b), and two-dot chain line in FIG. 8(a) show peaks derived from the piezoelectric body which repeatedly present according to the principle of measurement. In addition, peaks present in the vicinity of a position of 2θ=41° and φ=0° in FIGS. 7(a) to 8(b) are peaks derived from platinum configuring the first electrode 60. Moreover peaks present in the vicinity of a position of 2θ=67.5° and φ=±35° and a position of 2θ=82° and φ=±30° in FIGS. 7(a) to 8(b) are peaks derived from silicon included in substrates. X marks in FIGS. 7(a) to 8(b) are peaks derived from platinum or silicon.

Two-Dimensional Mapping

Two-dimensional mapping which shows X-ray diffraction of the piezoelectric body layer was performed for Examples 1 to 3 and Comparative Examples 1 and 2. FIGS. 9 to 10 respectively show the results of the measurement.

Figure 9A:
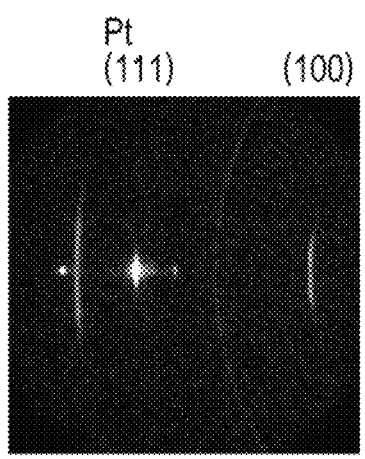
FIGS. 9A to 9D are two-dimensional mapping photographs that show X-ray diffraction strengths.
Figure 9B:
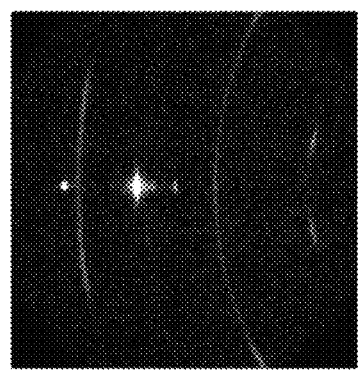
Figure 9C:
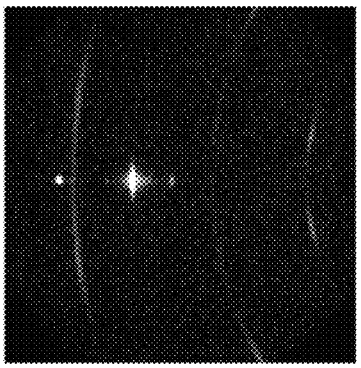
Figure 9D:
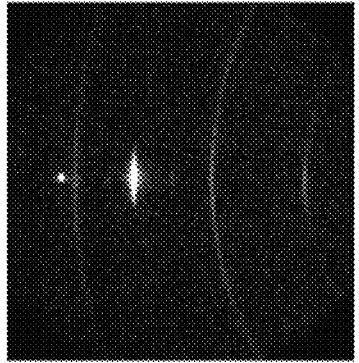
Figure 10:
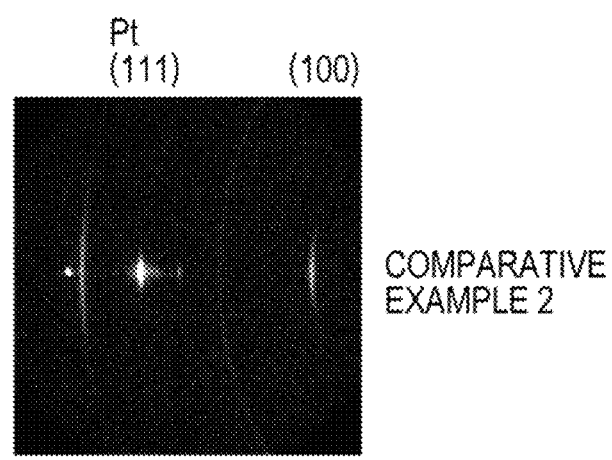
FIG. 10 is a two-dimensional mapping photograph that shows an X-ray diffraction strength.

In FIGS. 9(a) to 9(c), in Examples 1 to 3, a spot-shaped diffraction line that is divided across a central portion is observed at a position at which (100) plane diffraction lines are observed. From this, it was confirmed that the preferential orientation axis of the piezoelectric body layer 70 formed a predetermined angle with respect to the film thickness direction of the piezoelectric body layer 70, in other words, it was confirmed that the preferential orientation axis of the piezoelectric body layer 70 is oriented being inclined with respect to the (100) plane. In contrast to this, in Comparative Example 1 that is shown in FIG. 9(d), a band-shaped diffraction line was observed at a position where direction line of (100) plane is observed and spot-shaped diffraction line was not observed. In Comparative Example 2 shown in FIG. 10, a spot-shaped diffraction line is only observed in a central part at a position at which (100) plane diffraction lines are observed. It is also confirmed that in Comparative Example 2, the preferential orientation axis of the piezoelectric body layer 70 is not inclined with respect to the film thickness direction of the piezoelectric body layer 70 and the piezoelectric body layer 70 is oriented with respect to the (100) plane.

DBLI Measurement

Figure 11:
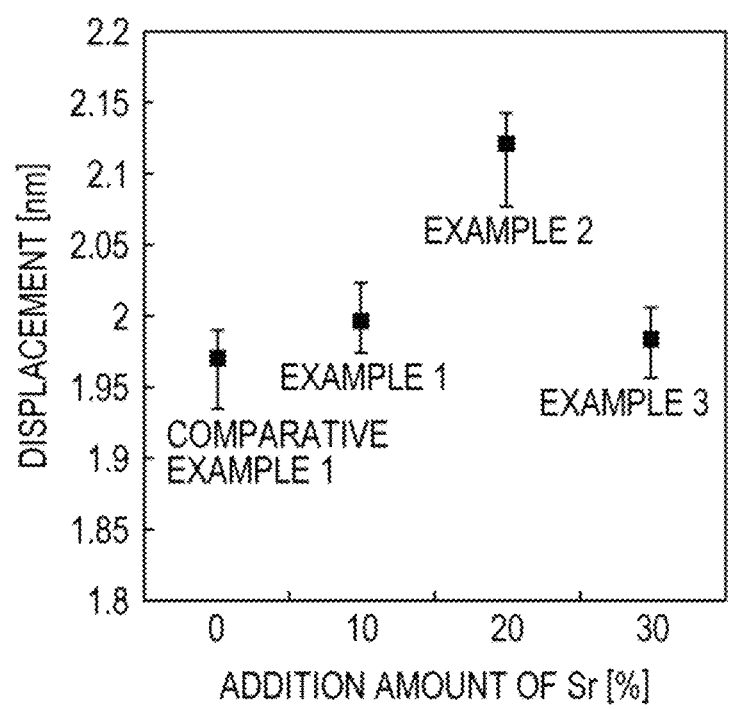
FIG. 11 is a view that shows measurement results of a displacement measurement device (DBLI).

An amount of displacement in Examples 1 to 3 and Comparative Example 1 was measured using a displacement measurement device (DBLI). The respective measurement results of Examples 1 to 3 and Comparative Example 1 are shown in FIG. 11.

As illustrated in the drawing, in comparison with Comparative Example 1 that does not include Sr, a large amount of displacement was obtained in Examples 1 to 3. In particular, a large amount of displacement was observed in a range in which the Sr content is 20%, or more specifically, a range of 0.15<y<0.25 in formula (1) above.

Examples 4 to 8

The piezoelectric elements according to Examples 4 to 8 are prepared using the same processes as Example 1 with the Bi excess amount and the Fe/Ti ratio in the compositional ratio of the solution for the seed layer 65 set as the ratios that are shown in Table 2. Amongst these examples, in Example 4, the seed layer was prepared without adding Bi in excess.

TABLE 2

|  | Bi:Sr:Fe:Ti<br>X * (1 − y):y:(1 − z):z | Bi<br>Excess x | Fe/Ti<br>(1 − z)/z |
|---|---|---|---|
| Example 4 | 0.8:0.2:0.5:0.5 | 1.00 | 1 |
| Example 5 | 0.92:0.2:0.5:0.5 | 1.15 | 1 |
| Example 6 | 0.976:0.2:0.5:0.5 | 1.22 | 1 |
| Example 7 | 0.92:0.2:0.4:0.6 | 1.15 | 0.67 |
| Example 8 | 0.92:0.2:0.6:0.4 | 1.15 | 1.5 |

Test 2
Two-Dimensional Mapping

In the same manner as Test 1, two-dimensional mapping which shows X-ray diffraction of the piezoelectric body layer was performed for Examples 4 to 8. FIGS. 12 to 13 respectively show the results of the measurement.

In Examples 4 to 8, a spot-shaped diffraction line that is divided across a central portion is observed at a position at which (100) plane diffraction lines are observed. From this, it was confirmed that, within a range of the Bi excess amount x being $1.0 \leq x < 1.3$, or more specifically, within a range of $1.0 \leq x \leq 1.22$, the preferential orientation axis of the piezoelectric body layer 70 formed a predetermined angle with respect to the film thickness direction of the piezoelectric body layer 70 regardless of the Bi excess amount x. In addition, it was confirmed that the preferential orientation axis of the piezoelectric body layer 70 forms a predetermined angle with respect to the film thickness direction of the piezoelectric body layer 70 within a range of $0.67 \leq Fe/Ti \leq 1.5$. However, since a clearer spot-shaped diffraction line is observed in Examples 4 to 7 than Example 8, it is understood that Fe/Ti is preferably $0.67 \leq Fe/Ti < 1.5$ and more preferably $0.67 \leq Fe/Ti \leq 1.0$.

Examples 9 to 10

The piezoelectric elements according to Examples 9 to 10 are prepared using the same processes as Example 1 with the compositional ratio of the solution for the seed layer 65 set as the ratios that are shown in Table 3.

Comparative Example 3

Except for the fact that the compositional ratio of the solution for the seed layer 65 is set as the ratio that is shown in Table 3, that is, Sr is not blended, the piezoelectric element according to Comparative Example 3 is prepared using the same processes as Example 1.

Test 3
Dielectric Constant

Measurement in which a frequency of a signal for detection was changed by applying a bias voltage of 20 V was performed using a "4294A" manufactured by Hewlett-Packard Company, and a dielectric constant was determined from a 1000 Hz value for the seed layers of Examples 9 to 10 and Comparative Example 3. The results are shown in Table 3. Additionally, since electric field loss in the piezoelectric body layer decreases the higher the dielectric constant is, it is possible to achieve an improvement in a piezoelectric characteristic, and therefore, it is possible to achieve an improvement in displacement.

TABLE 3

|  | Bi:Sr:Fe:Ti<br>X * (1 − y):y:(1 − z):z | Bi Excess x | Dielectric Constant |
|---|---|---|---|
| Example 9 | 0.9:0.1:0.5:0.5 | 1.00 | 366 |
| Example 10 | 0.7:0.3:0.5:0.5 | 1.00 | 467 |
| Comparative Example 3 | 1.0:0:0.5:0.5 | 1.00 | 263 |

From the results of Table 3, it was observed that a higher dielectric constant was obtained by the piezoelectric body layers of Examples 9 to 10 than the piezoelectric body layer of Comparative Example 3. It was observed that the higher dielectric constant was obtained in Example 10 than that of in Example 9.

Other Embodiments

An embodiment of a piezoelectric element, a liquid ejecting head in which a piezoelectric element is installed and a liquid ejecting apparatus of the invention has been described above, but the basic configuration of the invention is not limited to the descriptions mentioned above. For example, in the abovementioned Embodiment 1, a silicon monocrystalline substrate was illustrated as an example of the flow channel forming substrate 10, but the configuration thereof is not limited, and for example, may use an SOI substrate or a material such as glass.

In Embodiment 1 above, description was given using an ink jet type recording head as an example of a liquid ejecting head, but the invention can be widely applied to general liquid ejecting heads, and naturally, can be applied to a liquid ejecting heads that eject liquids other than ink. Examples of other liquid ejecting heads include various recording heads that are used in image recording apparatuses such as printers, color material ejecting heads that are used in the production of color filters such as liquid crystal displays, electrode material ejecting heads that are used in electrode formation such as organic EL displays, Field Emission Displays (FEDs) and the like, and living organic material ejecting heads that are used in the production of biochips.

In addition, the piezoelectric element of the invention is not limited to a piezoelectric element that is used in a liquid ejecting head, and also be used in other piezoelectric application devices. Examples of other piezoelectric application devices include ultrasonic wave devices such as ultrasonic wave transmitters, ultrasonic wave motors, temperature-electricity converters, pressure-electricity converters, ferroelectric transistors, piezoelectric transformers, screening filters of harmful rays such as infrared rays, optical filters that use a photonic crystal effect of quantum dot formation, a filter of an optical filter or the like that uses an optical interference film and the like. In addition, the invention can also be applied to piezoelectric elements that are used as sensors, and piezoelectric elements that are used as ferroelectric memory. Examples of sensors in which a piezoelectric element can be used include infrared sensors, ultrasonic wave sensors, thermal sensors, pressure sensors, pyroelectric sensors, and gyro sensors (angular velocity sensors).

In addition, the piezoelectric element of the invention can be suitably used as a ferroelectric body. Examples of ferroelectric bodies in which it is possible to use the invention suitably include ferroelectric transistors (FeFET), ferroelectric arithmetic circuits (FeLogic), ferroelectric capacitors and the like. Furthermore, since the piezoelectric element 300 of the present embodiment has favorable pyroelectric characteristics, it is possible to use the piezoelectric element 300 suitably in pyroelectric elements. Examples of pyroelectric elements in which it is possible to use the invention suitably include temperature detectors, biological detectors, infrared detectors, terahertz detectors, heat-electricity converters and the like. These devices are also included in the piezoelectric application device in the present invention.

What is claimed is:

1. A piezoelectric element comprising:
    a first electrode;
    a piezoelectric body layer; and
    a second electrode, and
    a seed layer formed between the first electrode and the piezoelectric body layer, the seed layer controls the piezoelectric body layer to be preferentially oriented with respect to a specific crystal plane,
    wherein the seed layer is formed from a composite oxide with a perovskite structure that includes at least Bi, Sr, Fe and Ti, and
    an element ratio of Bi, Sr, Fe, and Ti in the seed layer satisfies the Formula (1) below:

$$Bi:Sr:Fe:Ti = x \cdot (1-y) : y : 1-z : z \quad (1)$$

$(1.0 \leq x < 1.3, 0 < y < 0.4, 0.4 \leq z \leq 0.6)$.

2. The piezoelectric element according to claim 1, wherein, in the Formula (1), $1.0 \leq x \leq 1.22$, $0.1 \leq y \leq 0.3$, $0.4 \leq z \leq 0.6$ are satisfied.

3. The piezoelectric element according to claim 1, wherein a preferential orientation axis of the piezoelectric body layer forms an angle with respect to a film thickness direction of the piezoelectric body layer.

4. The piezoelectric element according to claim 1, wherein an absolute value of a diffraction angle of a peak center, which is obtained through (100) plane X-ray inverse lattice mapping of the crystal of the piezoelectric body layer, is within a range of 5° to 12°.

5. A piezoelectric application device comprising:
    the piezoelectric element according to claim 1.

* * * * *